(12) United States Patent
Choi et al.

(10) Patent No.: US 10,957,750 B2
(45) Date of Patent: Mar. 23, 2021

(54) ELECTROLUMINESCENT DISPLAY DEVICE

(71) Applicant: LG Display Co., Ltd., Seoul (KR)

(72) Inventors: Dae-Jung Choi, Paju-si (KR); Hyun-Il Ko, Paju-si (KR)

(73) Assignee: LG DISPLAY CO., LTD., Seoul (KR)

( * ) Notice: Subject to any disclaimer, the term of this patent is extended or adjusted under 35 U.S.C. 154(b) by 74 days.

(21) Appl. No.: 16/222,652

(22) Filed: Dec. 17, 2018

(65) Prior Publication Data
US 2019/0198589 A1    Jun. 27, 2019

(30) Foreign Application Priority Data

Dec. 27, 2017    (KR) .................... 10-2017-0180779

(51) Int. Cl.
*H01L 27/12* (2006.01)
*H01L 27/32* (2006.01)
(Continued)

(52) U.S. Cl.
CPC ...... *H01L 27/3246* (2013.01); *H01L 27/3276* (2013.01); *H01L 51/5218* (2013.01);
(Continued)

(58) Field of Classification Search
CPC ..... H01L 51/504–5044; H01L 27/3276; H01L 27/12; H01L 51/5044; H01L 51/5215; H01L 51/5212; H01L 27/326; H01L 51/5203; H01L 51/56; H01L 51/5056; H01L 27/3211; H01L 27/3272; H01L 51/0005; H01L 27/124; H01L 29/78633; H01L 27/3246; H01L 27/3262; H01L 51/5096; H01L 51/5072; H01L 51/5092; H01L 51/5228; H01L 27/1259; H01L 29/41733; H01L 29/42384;
(Continued)

(56) References Cited

U.S. PATENT DOCUMENTS

2009/0310076 A1* 12/2009 Hsieh ................ G02F 1/134309
                                                349/144
2011/0263093 A1* 10/2011 Joo ..................... H01L 45/1233
                                                438/382
(Continued)

*Primary Examiner* — Mary A Wilczewski
(74) *Attorney, Agent, or Firm* — Birch, Stewart, Kolasch & Birch, LLP

(57) ABSTRACT

An electroluminescent display device can include a substrate having a display area and a pad region; a thin film transistor in the display area; first and second pads in the pad region; an insulating layer covering the thin film transistor and the first and second pads; first and second pad contact holes exposing the first and second pads, respectively; a light-emitting diode electrically connected to the thin film transistor and including first and second electrodes and a light-emitting layer interposed therebetween; and first and second auxiliary pads on the insulating layer, the first and second auxiliary pads being electrically connected to the first and second pads, respectively, in which each of the first electrode and the first and second auxiliary pads includes a first layer formed of a transparent conductive material and a second layer formed of a metallic material, and a surface length between the first and second auxiliary pads is greater than a distance between the first and second auxiliary pads.

20 Claims, 8 Drawing Sheets

(51) Int. Cl.
*H01L 51/52* (2006.01)
*H01L 51/56* (2006.01)

(52) U.S. Cl.
CPC ............... *H01L 2251/5315* (2013.01); *H01L 2251/5392* (2013.01)

(58) Field of Classification Search
CPC ........... H01L 29/66969; H01L 29/7869; H01L 27/1225; H01L 27/1248; H01L 27/1255; H01L 2224/02125–02126; H01L 2224/02165–02166; H01L 51/502; H01L 2224/2612–26175; H01L 27/1244; H01L 51/5218; H01L 2251/5315; H01L 2251/5392; H05B 45/60
See application file for complete search history.

(56) References Cited

U.S. PATENT DOCUMENTS

| | | | |
|---|---|---|---|
| 2014/0319515 A1* | 10/2014 | Nagayama | H01L 27/1248 257/43 |
| 2016/0149155 A1* | 5/2016 | Kim | H01L 27/3276 257/40 |
| 2017/0110530 A1* | 4/2017 | Lee | H01L 27/3248 |
| 2018/0124933 A1* | 5/2018 | Park | H01L 51/5228 |
| 2018/0190944 A1* | 7/2018 | Lee | H01L 51/5215 |
| 2018/0341143 A1* | 11/2018 | Hyodo | G02F 1/133345 |
| 2019/0115561 A1* | 4/2019 | Tang | H01L 51/5228 |
| 2019/0206973 A1* | 7/2019 | Kim | H01L 51/5212 |
| 2019/0348491 A1* | 11/2019 | Chung | H01L 27/3258 |

* cited by examiner

ELECTROLUMINESCENT DISPLAY DEVICE

CROSS-REFERENCE TO RELATED APPLICATION

The present application claims priority from and the benefit under 35 U.S.C § 119(a) of Korean Patent Application No. 10-2017-0180779 filed in the Republic of Korea on Dec. 27, 2017, which is hereby incorporated by reference in its entirety.

BACKGROUND OF THE INVENTION

Field of the Disclosure

The present disclosure relates to an electroluminescent display device, and more particularly, to an electroluminescent display device capable of preventing an electrical short problem between pads.

Discussion of the Related Art

Among flat panel displays, electroluminescent display devices have wider viewing angles as compared with liquid crystal display devices because they are self-luminous. The electroluminescent display devices have a thin thickness and a light weight because they do not need a backlight and also have advantages in power consumption.

The electroluminescent display devices are driven by a low voltage of direct current (DC) and have a short response time. The electroluminescent display devices are stable from outer impacts and are usable in a wide range of temperatures because their components are solid. Particularly, the electroluminescent display devices have an advantage of low manufacturing costs.

In an active matrix type electroluminescent display device, a voltage for controlling a current applied to a pixel is charged in a storage capacitor. Thus, since the voltage is maintained until a signal for a next frame is applied, regardless of the number of gate lines, light is emitted while one screen is displayed.

FIG. 1 is a schematic cross-sectional view of a related art electroluminescent display device.

In FIG. 1, the related art electroluminescent display device 10 includes a substrate 11 on which a display area DA and a non-display area NDA are defined, a driving thin film transistor Td, a light-emitting diode D, a pad 22 and an auxiliary pad 80.

Also, the driving thin film transistor Td may include a semiconductor layer, a gate electrode, a source electrode and a drain electrode on the substrate 11.

An insulating layer 30 covers the driving thin film transistor Td and has a drain contact hole 32 exposing the drain electrode of the driving thin film transistor Td.

The light-emitting diode D is formed on the insulating layer 30, and the light-emitting diode D includes a first electrode 40 connected to the drain electrode of the driving thin film transistor Td through the drain contact hole 32, a light-emitting layer 50 formed on the first electrode 40, and a second electrode formed on the light-emitting layer 50.

For example, the first electrode 40 may be an anode, and the second electrode 60 may be a cathode.

In addition, a bank 70 is formed on the insulating layer 30 and covers edges of the first electrode 40. The bank 70 has an opening exposing a central portion of the first electrode 40, and the light-emitting layer 50 is formed in the opening of the bank 70. The second electrode 60 is formed on the light-emitting layer 50 and the bank 70.

The driving thin film transistor Td and the light-emitting diode D are disposed in each pixel region P in the display area DA.

Moreover, the pad 22 is disposed in a pad region (PAD) in the non-display area NDA. For example, the pad 22 may be a data pad connected to a data line or a gate pad connected to a gate line.

The insulating layer 30 covers the pad 22 and has a pad contact hole 34 exposing the pad 22. For example, the pad contact hole 34 may include first and second pad contact holes 34a and 34b spaced apart from each other.

In addition, the auxiliary pad 80 is formed on the insulating layer 30 and connected to the pad 22 through the pad contact hole 34. The auxiliary pad 80 is disposed on the same layer as the first electrode 40 and is formed of the same material as the first electrode 40.

Also, the electroluminescent display device 10 is a top emission type in which light from the light-emitting layer 50 is output to the outside through the second electrode 60, and in this instance, the first electrode 40 has a reflection property to increase light efficiency.

The first electrode 40 may include first and second layers 42 and 46 formed of a transparent conductive material having relatively high work function and a third layer 44 disposed between the first and second layers 42 and 46 and formed of a metallic material having a relatively high reflection property.

Further, the auxiliary pad 80 may also include first and second layers 82 and 86 formed of a transparent conductive material and a third layer 84 disposed between the first and second layers 86.

Accordingly, the first electrode 40 serves as the anode, and light from the light-emitting layer 50 is reflected by the first electrode 40, thereby increasing brightness of the top emission type electroluminescent display device 10.

By the way, in the electroluminescent display device 10, an electrical short occurs between adjacent pads 22, and thus there is a problem in driving properties of the electroluminescent display device 10.

As described above, in the top emission type electroluminescent display device of the related art, the electrical short occurs between the adjacent pads 22, and this is caused by electrical connection between the adjacent pads 22 due to migration of a metal such as silver or aluminum in the adjacent pads 22.

That is, referring to FIG. 2, which is a schematic cross-sectional view illustrating an electrical short problem between pads, a plurality of pads 22 are formed to be adjacent to each other in a pad region PAD, and an auxiliary pad 80 is formed to be electrically connected to each pad 22.

The auxiliary pad 80 includes first and second layers 82 and 86 formed of a transparent conductive material and a third layer 84 disposed between the first and second layers 82 and 86 and formed of a metallic material having a relatively high reflection property. In the high temperature environment, sodium (Na) or potassium (K) in moisture act as an electrolyte, and the metallic material of the third layer 84 is migrated.

Therefore, adjacent auxiliary pads 80 are electrically connected to each other by the migrated metallic material in an area A between the adjacent auxiliary pads 80, and an electrical short between adjacent pads 22 occurs.

SUMMARY OF THE INVENTION

Accordingly, the present disclosure is directed to an electroluminescent display device that substantially obviates one or more of the problems due to limitations and disadvantages of the related art.

An object of the present disclosure is to provide an electroluminescent display device solving the electrical short problem between adjacent pads.

Additional features and advantages of the present disclosure will be set forth in the description which follows, and in part will be apparent from the description, or may be learned by practice of the present disclosure. The objectives and other advantages of the present disclosure will be realized and attained by the structure particularly pointed out in the written description and claims hereof as well as the appended drawings.

To achieve these and other advantages and in accordance with the purpose of the present disclosure, as embodied and broadly described herein, there is provided an electroluminescent display device that includes a substrate on which a display area and a pad region are defined; a thin film transistor in the display area on the substrate; first and second pads in the pad region on the substrate; an insulating layer covering the thin film transistor and the first and second pads and having first and second pad contact holes which expose the first and second pads, respectively; a light-emitting diode on the insulating layer in the display area, the light-emitting diode connected to the thin film transistor and including first and second electrodes and a light-emitting layer interposed therebetween; and first and second auxiliary pads on the insulating layer in the pad region, the first and second auxiliary pads connected to the first and second pads through the first and second pad contact holes, respectively, in which each of the first electrode and the first and second auxiliary pads includes a first layer formed of a metallic material and a second layer formed of a transparent conductive material, and a surface length between the first and second auxiliary pads is greater than a distance between the first and second auxiliary pads.

Both the foregoing general description and the following detailed description are by example and explanatory and are intended to provide further explanation of the present disclosure as claimed.

BRIEF DESCRIPTION OF THE DRAWINGS

The accompanying drawings, which are included to provide a further understanding of the present disclosure and which are incorporated in and constitute a part of this specification, illustrate embodiments of the present disclosure and together with the description serve to explain the principles of the present disclosure.

DETAILED DESCRIPTION OF THE EMBODIMENTS

Reference will now be made in detail to embodiments of the disclosure, examples of which are illustrated in the accompanying drawings.

Figure 3:
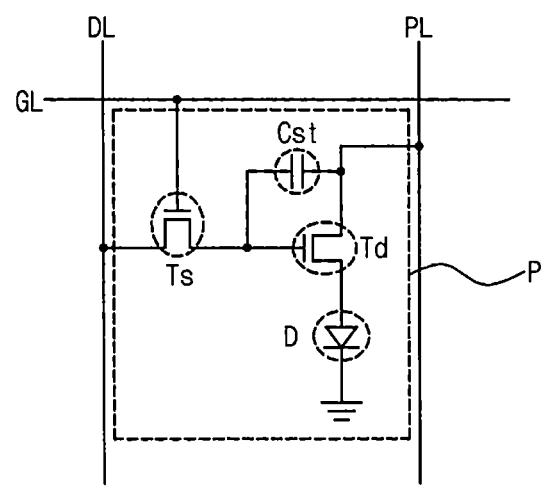
FIG. 3 is a circuit diagram of one pixel region of an electroluminescent display device according to an embodiment of the present disclosure.

FIG. 3 is a circuit diagram of one pixel region of an electroluminescent display device according to an embodiment of the present disclosure.

As shown in FIG. 3, in a display area of the electroluminescent display device, a gate line GL, a data line DL, and a power line PL, at least one of which crosses another to define a pixel region P, are formed, and a switching thin film transistor Ts, a driving thin film transistor Td, a storage capacitor Cst and a light-emitting diode D are formed in the pixel region P.

In a non-display area of the electroluminescent display device, a gate pad and a data pad for applying signals to the gate line GL and the data line DL are formed.

The switching thin film transistor Ts is connected to the gate line GL and the data line DL, the driving thin film transistor Td and the storage capacitor Cst are connected to the switching thin film transistor Ts and the power line PL, and the light-emitting diode D is connected to the driving thin film transistor Td.

In the electroluminescent display device, when the switching thin film transistor Ts is turned on by a gate signal applied through the gate line GL, a data signal from the data line DL is applied to a gate electrode of the driving thin film transistor Td and an electrode of the storage capacitor Cst through the switching thin film transistor Ts. The driving thin film transistor Td is turned on by the data signal applied to the gate electrode thereof. As a result, an electric current proportional to the data signal flows from the power line PL to the light-emitting diode D through the driving thin film transistor Td, and the light emitting diode D emits light at the luminance proportional to the electrical current flowing through the driving thin film transistor Td.

In addition, the storage capacitor Cst is charged by a voltage corresponding to the data signal, and the storage capacitor Cst constantly maintains a voltage at the gate electrode of the driving thin film transistor Td for one frame.

Accordingly, the electroluminescent display device can display an image from the gate signal and the data signal.

Figure 4:
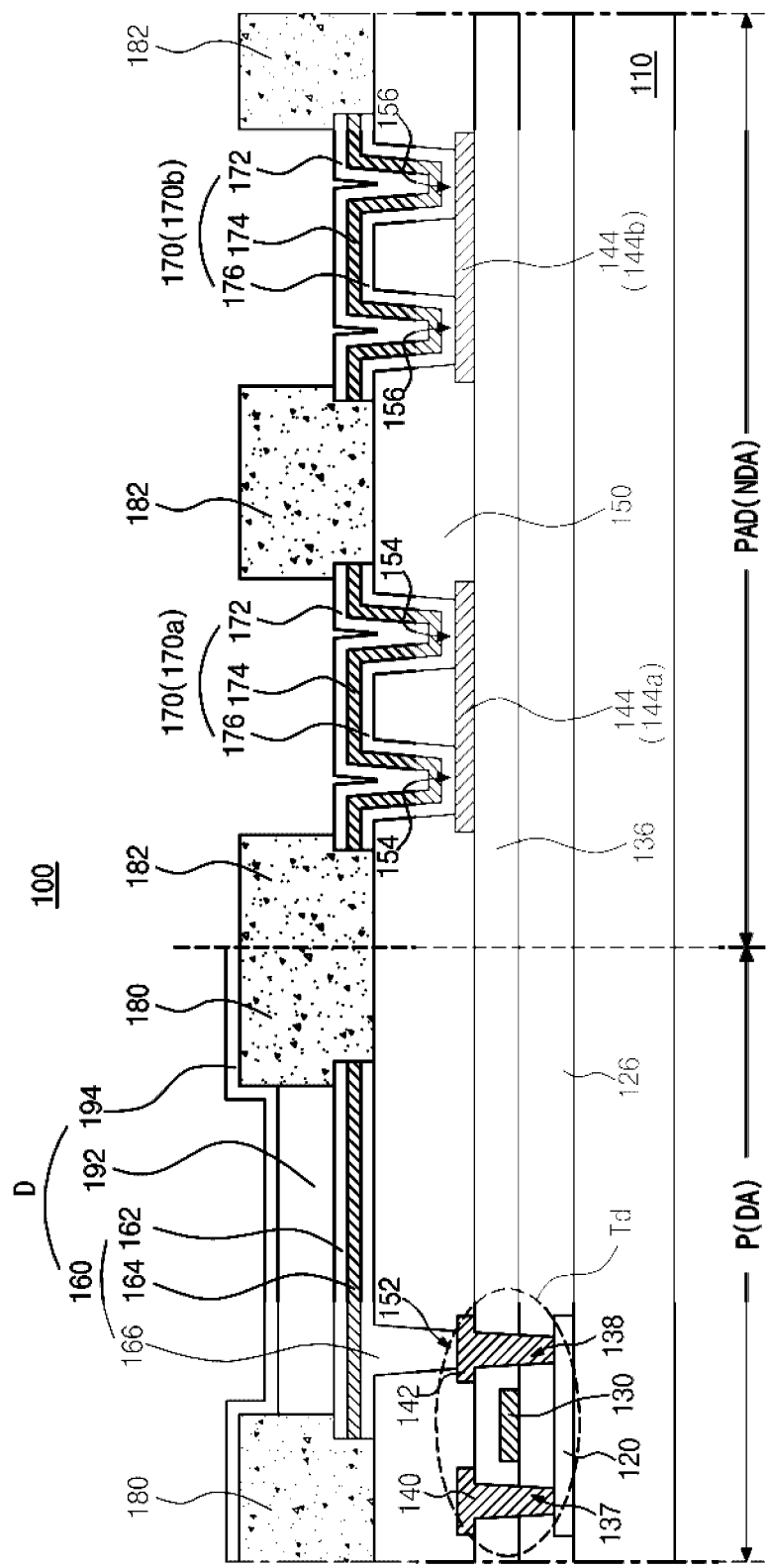
FIG. 4 is a schematic cross-sectional view of an electroluminescent display device according to an embodiment of the present disclosure.

FIG. 4 is a schematic cross-sectional view of an electroluminescent display device according to a first embodiment of the present disclosure.

In FIG. 4, the electroluminescent display device 100 includes a substrate 110, a light-emitting diode D, a pad 144, an auxiliary pad 170 connected to the pad 144, and an insulation pattern 182 disposed between adjacent auxiliary pads 170.

The pad 144 can be a data pad connected to a data line DL of FIG. 3. Alternatively, the pad 144 can be a gate pad, and in this instance, the gate pad can be formed of the same material and on the same layer as a gate line GL of FIG. 3.

The substrate 110 can be a glass substrate or a flexible plastic substrate. For example, the substrate 110 can be a polyimide substrate. A display area DA including a plurality of pixel regions P and a non-display area NDA disposed outside the display area DA and including a pad region PAD are defined on the substrate 110.

A driving thin film transistor Td is formed on the substrate 110 to correspond to each pixel region P. The driving thin film transistor Td can include a semiconductor layer 120, a gate electrode 130, a source electrode 140 and a drain electrode 142.

More specifically, the semiconductor layer 120 is formed on the substrate 110. The semiconductor layer 120 can be formed of an oxide semiconductor material or polycrystalline silicon.

When the semiconductor layer 120 is formed of an oxide semiconductor material, a light-blocking pattern can be formed under the semiconductor layer 120. The light-blocking pattern blocks light from being incident on the semiconductor layer 120 to thereby prevent the semiconductor layer 120 from being degraded by the light. Alternatively, the semiconductor layer 120 can be formed of polycrystalline silicon, and in this instance, impurities can be doped in both side portions of the semiconductor layer 120.

In addition, a buffer layer can be further formed between the substrate 110 and the semiconductor layer 120.

A gate insulating layer 126 of an insulating material is formed on the semiconductor layer 120 substantially all over the substrate 110. The gate insulating layer 126 can be formed of an inorganic insulating material such as silicon oxide or silicon nitride.

The gate electrode 130 of a conductive material such as a metal is formed on the gate insulating layer 126 to correspond to a central portion of the semiconductor layer 120. In addition, on the gate insulating layer 126, a gate line GL of FIG. 3 is formed in the display area DA, and a gate pad connected to the gate line GL is formed in the non-display area NDA. The gate line GL extends in a first direction. Moreover, a first capacitor electrode connected to the gate electrode 130 can be further formed on the gate insulating layer 126.

In FIG. 4, the gate insulating layer 126 is formed on a substantially entire surface of the substrate 110. Alternatively, the gate insulating layer 126 can be patterned to have the same shape as the gate electrode 130.

An interlayer insulating layer 136 of an insulating material is formed on the gate electrode 130 substantially all over the substrate 110. The interlayer insulating layer 136 can be formed of an inorganic insulating material, such as silicon oxide or silicon nitride, or can be formed of an organic insulating material, such as benzocyclobutene or photo-acryl.

The interlayer insulating layer 136 has first and second contact holes 137 and 138 exposing both side portions of the semiconductor layer 120. The first and second contact holes 137 and 138 are disposed at both sides of the gate electrode 130 and spaced apart from the gate electrode 130.

In FIG. 4, the first and second contact holes 137 and 138 are also formed in the gate insulating layer 126. Alternatively, when the gate insulating layer 126 is patterned to have the same shape as the gate electrode 130, the first and second contact holes 137 and 138 can be formed only in the interlayer insulating layer 136.

The source electrode 140 and the drain electrode 142 of a conductive material such as a metal are formed on the interlayer insulating layer 136. In addition, on the interlayer insulating layer 136, a data line DL of FIG. 3 is formed in the display area DA and the pad 144 is formed in the pad region DAP. The data line DL of FIG. 3 extends in a second direction crossing the first direction. The pad 144 is connected to the data line DL of FIG. 3. The pad 144 includes first and second pads 144a and 144b adjacent to and spaced apart from each other.

Further, on the interlayer insulating layer 136, a second capacitor electrode and a power line PL of FIG. 3 can be formed. The second capacitor electrode is connected to the source electrode 140 and overlaps the first capacitor electrode. The power line PL of FIG. 3 is spaced apart from the data line DL of FIG. 3 and extends in parallel with the data line DL of FIG. 3.

The source electrode 140 and the drain electrode 142 are spaced from each other with the gate electrode 130 as a center and are connected to the both side portions of the semiconductor layer 120 through the first and second contact holes 137 and 138, respectively. The data line DL of FIG. 3 of the second direction crosses the data line GL of FIG. 3 to define the pixel region P. Also, the power line PL of FIG. 3 can be formed on the same layer as and spaced apart from the gate line GL of FIG. 3 in parallel, and thus the power line PL of FIG. 3 can cross the data line DL.

The driving thin film transistor Td has a coplanar structure in which the gate electrode 130, the source electrode 140 and the drain electrode 142 are disposed over the semiconductor layer 120.

Alternatively, the driving thin film transistor Td can have an inverted staggered structure, in which the gate electrode is disposed under the semiconductor layer and the source electrode and the drain electrode are disposed over the semiconductor layer. In this instance, the semiconductor layer can be formed of amorphous silicon.

As described above, a switching thin film transistor Ts of FIG. 3 is further formed on the substrate 110. The switching thin film transistor Ts of FIG. 3 can have substantially the same structure as the driving thin film transistor Td.

The gate electrode 130 of the driving thin film transistor Td is connected to a drain electrode of the switching thin film transistor Ts, and the source electrode 140 of the driving thin film transistor Td is connected to the power line PL of FIG. 3. In addition, a gate electrode and a source electrode of the switching thin film transistor Ts are connected to the gate line GL of FIG. 3 and the data line DL of FIG. 3, respectively.

A passivation layer 150 is formed on the driving thin film transistor Td. The passivation layer 150 can be formed of an inorganic insulating material, such as silicon oxide or silicon nitride, or an organic insulating material, such as photo-acryl or benzocyclobutene.

The passivation layer 150 includes a drain contact hole 152 exposing the drain electrode 142 of the driving thin film transistor Td and first and second pad contact holes 154 and 156 exposing the first and second pads 144a and 144b, respectively.

In FIG. 4, each of the first and second pad contact holes 154 and 156 has two holes, but the present disclosure is not limited thereto. For example, one first pad contact hole 154 and one second pad contact hole 156 can be formed to correspond to the first pad 144a and the second pad 144b, respectively.

A first electrode 160 and the auxiliary pad 170 are formed on the passivation layer 150. The first electrode 160 corresponds to each pixel region P and is connected to the drain electrode 142 of the driving thin film transistor Td through the drain contact hole 152. The auxiliary pad 170 includes first and second auxiliary pads 170a and 170b, which are connected to the first and second pads 144a and 144b through the first and second pad contact holes 154 and 156, respectively.

The first electrode 160 can be an anode. The first electrode 160 includes a first layer 162 formed of a conductive material having relatively high work function, a second layer 164 positioned under the first layer 162 and formed of a metallic material having a relatively high reflection property, and a third layer 166 positioned under the second layer 164 and formed of a conductive material having a relatively good interface property with the passivation layer 150 (e.g., conductive material of third layer 166 can adhere well with the passivation layer 150).

That is, the electroluminescent display device 100 of the present disclosure is a top emission type, and the first electrode 160 includes the second layer 164 having a relatively high reflection property.

For example, in the first electrode 160, the first layer 162 can be formed of a transparent conductive material, such as indium tin oxide (ITO) or indium zinc oxide (IZO), the second layer 164 can be formed of a high reflective metallic material, such as silver, silver alloy, aluminum or aluminum alloy, and the third layer 166 can be formed of one of ITO, IZO and molybdenum-titanium alloy (MoTi). Here, the silver alloy or the aluminum alloy can include at least one of palladium and copper, but the present disclosure is not limited thereto.

Each of the first and second auxiliary pads 170a and 170b has the same structure as the first electrode 160. Namely, each of the first and second auxiliary pads 170a and 170b can have a structure including a first layer 172 formed of a transparent conductive material, such as ITO or IZO, a second layer 174 positioned between the first layer 172 and the passivation layer 150 and formed of silver, silver alloy, aluminum or aluminum alloy, and a third layer 176 positioned between the second layer 174 and the passivation layer 150 and formed of one of ITO, IZO and MoTi.

In addition, the third layer 166 of the first electrode 160 is to improve an interface property between the passivation layer 150 and the second layer 164 of the first electrode 160, for example, adhesion between the passivation layer 150 and the second layer 164 of the first electrode 160, and the third layer 166 may be omitted. That is, the first electrode 160 can have a double-layer structure including the first layer 162 formed of a transparent conductive material such as ITO or IZO and the second layer 164 positioned between the first layer 162 and the passivation layer 150 and formed of silver, silver alloy, aluminum or aluminum alloy. Similarly, the first and second auxiliary pads 170a and 170b can also have a double-layer structure including the first layer 172 formed of a transparent conductive material, such as ITO or IZO, and the second layer 174 positioned between the first layer 172 and the passivation layer 150 and formed of silver, silver alloy, aluminum or aluminum alloy.

A bank 180 is formed on the passivation layer 150 and covers edges of the first electrode 160. That is, the bank 180 is disposed at a boundary of the pixel region P and has an opening corresponding to the pixel region P to thereby surround the pixel region P and expose a central portion of the first electrode 160.

In addition, the insulation pattern 182 covering edges of the first and second auxiliary pads 170a and 170b is formed in the pad region PAD on the passivation layer 150. That is, the insulation pattern 182 covers edges of the first and second auxiliary pads 170a and 170b and exposes centers of the first and second auxiliary pads 170a and 170b. For example, the insulation pattern 182 can have a reverse tapered shaped relative to the substrate 110. The insulation pattern 182 is formed of the same material as the bank 180 and on the same layer as the bank 180.

A light-emitting layer 192 is formed on the first electrode 160. For example, the light-emitting layer 192 can be formed through a solution process using a liquid-type luminous material.

The light-emitting layer 192 can include an organic luminous material, such as a phosphorescent compound or a fluorescent compound, or an inorganic luminous material such as a quantum dot.

The light-emitting layer 192 can have a single-layer structure of an emitting material layer formed of a luminous material. Alternatively, to improve light emission efficiency, the light-emitting layer 192 can further include a hole injection layer and a hole transporting layer, which are sequentially stacked between the first electrode 160 and the emitting material layer, and an electron transporting layer and an electron injection layer, which are sequentially stacked on the emitting material layer. Here, the electrode injection layer can be formed substantially all over the display area DA and can be positioned on a side surface and an upper surface of the bank 180.

A second electrode 194 is formed on the light-emitting layer 192 in the display area DA. The second electrode 194 is disposed substantially all over the display area DA and is formed of a conductive material having relatively low work function to be able to act as a cathode. For example, the second electrode 194 can be formed of one of aluminum (Al), magnesium (Mg), aluminum-magnesium alloy (AlMg), and magnesium-silver alloy (MgAg).

The first electrode 160, the second electrode 194 facing the first electrode 160, and the light-emitting layer 192 interposed between the first and second electrodes 160 and 194 constitute the light-emitting diode D.

In the electroluminescent display device 100 according to the first embodiment of the present disclosure, each of the first and second auxiliary pads 170a and 170b includes the second layer 174 formed of silver, silver alloy, aluminum or aluminum alloy, and the edges of the first and second auxiliary pads 170a and 170b are covered by the insulation pattern 182. Therefore, the metal migration from the second layer 174 formed of silver, silver alloy, aluminum or aluminum alloy is blocked by the insulation pattern 182.

Accordingly, it is possible to prevent the electrical connection between the first and second auxiliary pads 170a and 170b and the electrical short problem between the first and second pads 144a and 144b due to the metal migration.

In addition, a circuit board such as a flexible printed circuit board (FPCB) is attached to the auxiliary pads 170, and a signal is applied to the data line DL of FIG. 3 through the pads 144.

In this way, a contact area between the auxiliary pad 170 and the circuit board may be decreased due to the insulation pattern 182 covering the edges of the auxiliary pad 170.

Figure 5:
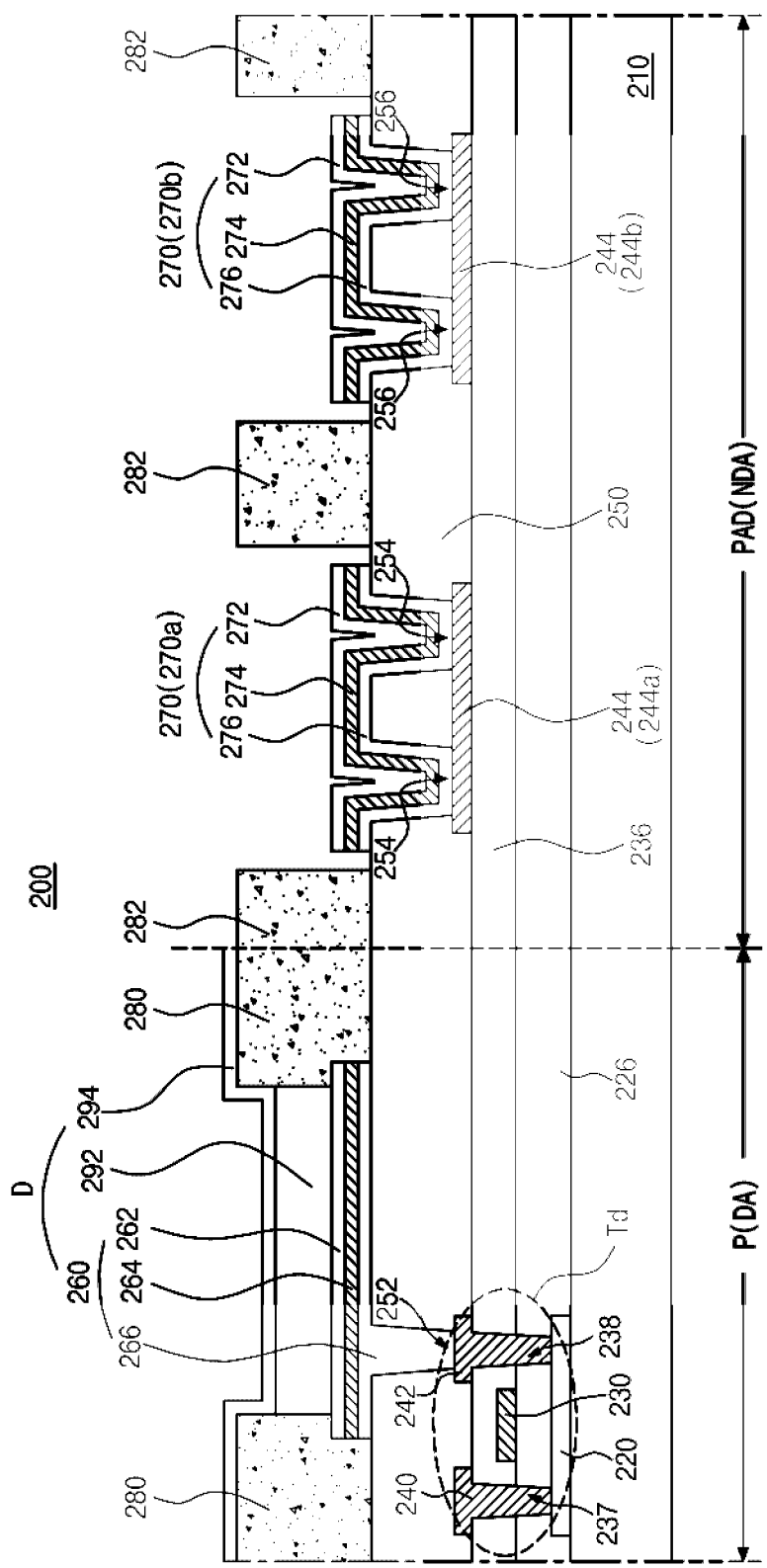
FIG. 5 is a schematic cross-sectional view of an electroluminescent display device according to another embodiment of the present disclosure.

FIG. 5 is a schematic cross-sectional view of an electroluminescent display device according to a second embodiment of the present disclosure. The electroluminescent display device of the second embodiment has similar or same parts as that of the first embodiment, and descriptions of the similar or same parts will be omitted or shortened.

In FIG. 5, the electroluminescent display device 200 according to the second embodiment of the present disclosure includes a substrate 210, a light-emitting diode D, a pad 244, an auxiliary pad 270 connected to the pad 244, and an insulation pattern 282 disposed between adjacent auxiliary pads 270 and spaced apart from the auxiliary pads 270.

The pad 244 can be a data pad connected to a data line DL of FIG. 3. Alternatively, the pad 244 can be a gate pad, and in this instance, the gate pad can be formed of the same material and on the same layer as a gate line GL of FIG. 3.

A display area DA including a plurality of pixel regions P and a non-display area NDA disposed outside the display area DA and including a pad region PAD are defined on the substrate 210.

A driving thin film transistor Td is formed in the pixel region P of the display area DA on the substrate 210, and the pad 244 is formed in the pad region PAD of the non-display area NDA on the substrate 210. The driving thin film transistor Td can include a semiconductor layer 220, a gate electrode 230, a source electrode 240 and a drain electrode 242. The pad 244 can include first and second pads 244a and 244b.

In addition, a gate insulating layer 226 and an interlayer insulating layer 236 are sequentially formed between the substrate 210 and the pad 244. The interlayer insulating layer 236 has first and second contact holes 237 and 238 exposing both side portions of the semiconductor layer 220 with the gate insulating layer 226. The source electrode 240 and the drain electrode 242 are connected to the both side portions of the semiconductor layer 220 through the first and second contact holes 237 and 238, respectively.

A passivation layer 250 is formed on the driving thin film transistor Td and the first and second pads 244a and 244b. The passivation layer 250 includes a drain contact hole 252 exposing the drain electrode 242 of the driving thin film transistor Td and first and second pad contact holes 254 and 256 exposing the first and second pads 244a and 244b, respectively.

A first electrode 260 and the auxiliary pad 270 are formed on the passivation layer 250. The first electrode 260 corresponds to each pixel region P and is connected to the drain electrode 242 of the driving thin film transistor Td through the drain contact hole 252. The auxiliary pad 270 includes first and second auxiliary pads 270a and 270b, which are connected to the first and second pads 244a and 244b through the first and second pad contact holes 254 and 256, respectively.

The first electrode 260 can be an anode. The first electrode 260 includes a first layer 262 formed of a conductive material having relatively high work function, a second layer 264 positioned under the first layer 262 and formed of a metallic material having a relatively high reflection property, and a third layer 266 positioned under the second layer 264 and formed of a conductive material having a relatively good interface property with the passivation layer 250.

For example, in the first electrode 260, the first layer 262 can be formed of a transparent conductive material, such as indium tin oxide (ITO) or indium zinc oxide (IZO), the second layer 264 can be formed of a high reflective metallic material such as, silver, silver alloy, aluminum or aluminum alloy, and the third layer 266 can be formed of one of ITO, IZO and molybdenum-titanium alloy (MoTi). Here, the silver alloy or the aluminum alloy can include at least one of palladium and copper, but the present disclosure is not limited thereto.

Each of the first and second auxiliary pads 270a and 270b has the same structure as the first electrode 260. Namely, each of the first and second auxiliary pads 270a and 270b may have a structure including a first layer 272 formed of a transparent conductive material such as ITO or IZO, a second layer 274 positioned between the first layer 272 and the passivation layer 250 and formed of silver, silver alloy, aluminum or aluminum alloy, and a third layer 276 positioned between the second layer 274 and the passivation layer 250 and formed of one of ITO, IZO and MoTi.

Also, the third layer 266 of the first electrode 260 and the third layers 276 of the first and second auxiliary pads 270a and 270b may be omitted, and the first electrode 260 and the first and second auxiliary pads 270a and 270b can have a double-layer structure including the first layers 262 and 272 formed of a transparent conductive material such as ITO or IZO and the second layers 264 and 274 respectively positioned between the first layers 262 and 272 and the passivation layer 250 and formed of silver, silver alloy, aluminum or aluminum alloy.

A bank 280 is formed on the passivation layer 250 and covers edges of the first electrode 260. That is, the bank 280 is disposed at a boundary of the pixel region P and has an opening corresponding to the pixel region P to thereby surround the pixel region P and expose a central portion of the first electrode 260.

In addition, the insulation pattern 282 is formed in the pad region PAD on the passivation layer 250. The insulation pattern 282 is positioned between the first and second auxiliary pads 270a and 270b and is spaced apart from the first and second auxiliary pads 270a and 270b. That is, a width of the insulation pattern 282 is smaller than a distance between the first and second auxiliary pads 270a and 270b. Since the insulation pattern 282 is disposed between the first and second auxiliary pads 270a and 270b, a surface length between the first and second auxiliary pads 270a and 270b is greater than the distance between the first and second auxiliary pads 270a and 270b. Here, the surface length between the first and second auxiliary pads 270a and 270b includes a length along an exposed upper surface of the insulation pattern 282, lengths along exposed side surfaces of the insulation pattern 282, a length along an upper surface of the passivation layer 250 between the first auxiliary pad 270a and the insulation pattern 282, and a length along an upper surface of the passivation layer 250 between the second auxiliary pad 270b and the insulation pattern 282. In other words, the insulation pattern 282 provides a longer surface length between adjacent pads and block the flow of metal migrated between the pads (e.g., in order for a short to occur, metal would have to migrate up the sides, over the top and around insulation pattern 282, which would be highly unlikely).

Figure 1:
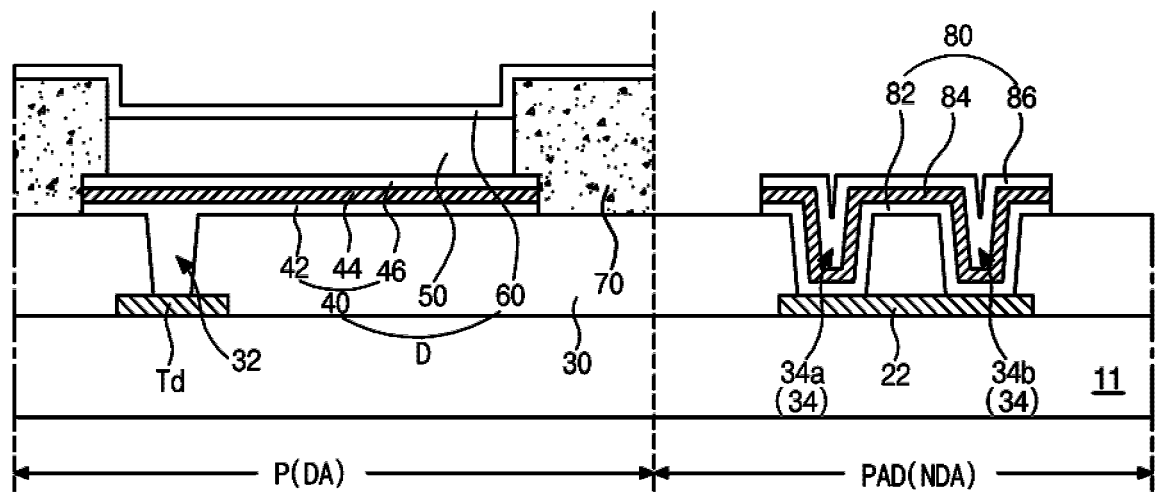
FIG. 1 is a schematic cross-sectional view of a related art electroluminescent display device.
Figure 2:
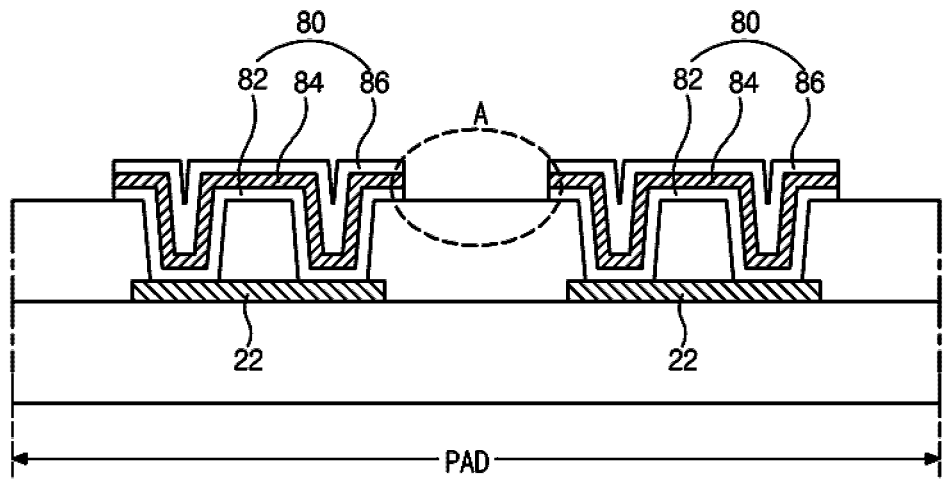
FIG. 2 is a schematic cross-sectional view illustrating an electrical short problem between pads.

In contrast to FIG. 4, since there is no element between adjacent auxiliary pads 22 in the related art device of FIG. 2, a surface length between the adjacent auxiliary pads 22, which is a width of an upper surface of the passivation layer 30 of FIG. 2 between the adjacent auxiliary pads 22, is equal to a distance between the adjacent auxiliary pads 22. Accordingly, a path of the metal migration between the adjacent auxiliary pads 22 is short, and the electrical connection between the adjacent auxiliary pads 22 easily occurs due to the metal migration.

Further, in the electroluminescent display device 200 according to the second embodiment of the present disclosure, since the insulation pattern 282 is disposed between the first and second auxiliary pads 270a and 270b, the path of the metal migration increases, and it is possible to prevent electrical connection or a short between adjacent auxiliary pads 270 due to the metal migration.

A light-emitting layer 292 is formed on the first electrode 260. The light-emitting layer 292 can include an organic luminous material, such as a phosphorescent compound or a fluorescent compound, or an inorganic luminous material such as a quantum dot.

A second electrode 294 is formed on the light-emitting layer 292 in the display area DA. The second electrode 294 is disposed substantially all over the display area DA and is formed of a conductive material having relatively low work function to be able to act as a cathode.

The first electrode 260, the second electrode 294 facing the first electrode 260, and the light-emitting layer 292 interposed between the first and second electrodes 260 and 294 constitute the light-emitting diode D.

As stated above, in the electroluminescent display device 200 according to the second embodiment of the present disclosure, since the insulation pattern 282 is disposed between the first and second auxiliary pads 270a and 270b adjacent to each other, the path of the metal migration increases, and it is possible to minimize and prevent the electrical connection between adjacent auxiliary pads 270 and prevent the electrical short problem between adjacent pads 244 due to the metal migration.

In addition, since the insulation pattern 282 is spaced apart from the first and second auxiliary pads 270a and 270b, it is possible to prevent the problem that the contact area between the first and second auxiliary pads 170a and 170b and the circuit board decreases due to the insulation pattern 182 in the electroluminescent display device 100 according to the first embodiment (e.g., extra space around the edges of the auxiliary pads makes it easier to connect to the circuit board during assembly).

Figure 6:
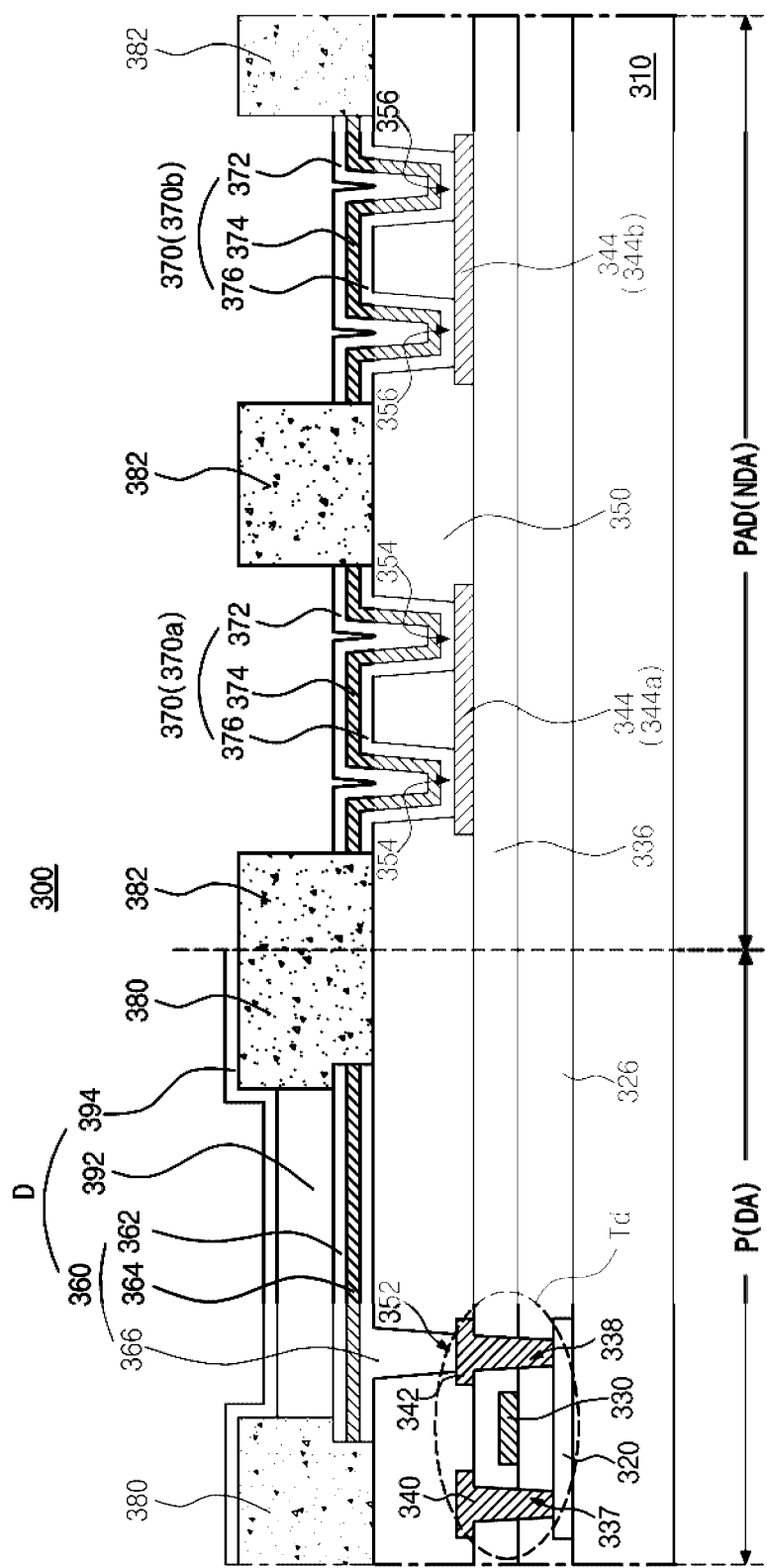
FIG. 6 is a schematic cross-sectional view of an electroluminescent display device according to an embodiment of the present disclosure.

FIG. 6 is a schematic cross-sectional view of an electroluminescent display device according to a third embodiment of the present disclosure. The electroluminescent display device of the third embodiment has similar or same parts as that of the first embodiment, and descriptions of the similar or same parts will be omitted or shortened.

In FIG. 6, the electroluminescent display device 300 according to the third embodiment of the present disclosure includes a substrate 310, a light-emitting diode D, a pad 344, an auxiliary pad 370 connected to the pad 344, and an insulation pattern 382 disposed between adjacent auxiliary pads 370.

The pad 344 can be a data pad connected to a data line DL of FIG. 3. Alternatively, the pad 344 can be a gate pad, and in this instance, the gate pad can be formed of the same material and on the same layer as a gate line GL of FIG. 3.

A display area DA including a plurality of pixel regions P and a non-display area NDA disposed outside the display area DA and including a pad region PAD are defined on the substrate 310.

A driving thin film transistor Td is formed in the pixel region P of the display area DA on the substrate 310, and the pad 344 is formed in the pad region PAD of the non-display area NDA on the substrate 310. The driving thin film transistor Td can include a semiconductor layer 320, a gate electrode 330, a source electrode 340 and a drain electrode 342. The pad 344 can include first and second pads 344a and 344b.

In addition, a gate insulating layer 326 and an interlayer insulating layer 336 are sequentially formed between the substrate 310 and the pad 344. The interlayer insulating layer 336 has first and second contact holes 337 and 338 exposing both side portions of the semiconductor layer 320 with the gate insulating layer 326. The source electrode 340 and the drain electrode 342 are connected to the both side portions of the semiconductor layer 320 through the first and second contact holes 337 and 338, respectively.

A passivation layer 350 is formed on the driving thin film transistor Td and the first and second pads 344a and 344b. The passivation layer 350 includes a drain contact hole 352 exposing the drain electrode 342 of the driving thin film transistor Td and first and second pad contact holes 354 and 356 exposing the first and second pads 344a and 344b, respectively.

A first electrode 360 and the auxiliary pad 370 are formed on the passivation layer 350. The first electrode 360 corresponds to each pixel region P and is connected to the drain electrode 342 of the driving thin film transistor Td through the drain contact hole 352. The auxiliary pad 370 includes first and second auxiliary pads 370a and 370b, which are connected to the first and second pads 344a and 344b through the first and second pad contact holes 354 and 356, respectively.

The first electrode 360 can be an anode. The first electrode 360 includes a first layer 362 formed of a conductive material having relatively high work function, a second layer 364 positioned under the first layer 362 and formed of a metallic material having a relatively high reflection property, and a third layer 366 positioned under the second layer 364 and formed of a conductive material having a relatively good interface property with the passivation layer 350.

For example, in the first electrode 360, the first layer 362 can be formed of a transparent conductive material, such as indium tin oxide (ITO) or indium zinc oxide (IZO), the second layer 364 can be formed of a high reflective metallic material, such as silver, silver alloy, aluminum or aluminum alloy, and the third layer 366 can be formed of one of ITO, IZO and molybdenum-titanium alloy (MoTi). Here, the silver alloy or the aluminum alloy can include at least one of palladium and copper, but the present disclosure is not limited thereto.

Each of the first and second auxiliary pads 370a and 370b has the same structure as the first electrode 360. Namely, each of the first and second auxiliary pads 370a and 370b can have a structure including a first layer 372 formed of a transparent conductive material such as ITO or IZO, a second layer 374 positioned between the first layer 372 and the passivation layer 350 and formed of silver, silver alloy, aluminum or aluminum alloy, and a third layer 376 positioned between the second layer 374 and the passivation layer 350 and formed of one of ITO, IZO and MoTi.

In addition, the third layer 366 of the first electrode 360 and the third layers 376 of the first and second auxiliary pads 370a and 370b can be omitted, and the first electrode 360 and the first and second auxiliary pads 370a and 370b can have a double-layer structure including the first layers 362 and 372 formed of a transparent conductive material, such as ITO or IZO, and the second layers 364 and 374 respectively positioned between the first layers 362 and 372 and the passivation layer 350 and formed of silver, silver alloy, aluminum or aluminum alloy.

A bank 380 is formed on the passivation layer 350 and covers edges of the first electrode 360. That is, the bank 380 is disposed at a boundary of the pixel region P and has an opening corresponding to the pixel region P to thereby surround the pixel region P and expose a central portion of the first electrode 360.

In addition, the insulation pattern 382 is formed in the pad region PAD on the passivation layer 350. The insulation pattern 382 is positioned between the first and second auxiliary pads 370a and 370b and is in contact with the first and second auxiliary pads 370a and 370b. Here, ends of the insulation pattern 382 are in accordance with and are in contact with ends of the first and second auxiliary pads 370a and 370b, and thus side surfaces of the insulation pattern 382 contact and cover side surfaces of the first and second auxiliary pads 370a and 370b. That is, a width of the insulation pattern 382 is equal to a distance between the first and second auxiliary pads 370a and 370b. In other words, a side of each of the auxiliary pads can be even with and in contact with a side of the insulation pattern 382. Since the insulation pattern 382 is disposed between the first and second auxiliary pads 370a and 370b while also covering the side surfaces of the first and second auxiliary pads 370a and 370b, the metal migration from the second layer 374 is blocked, and it is possible to prevent the electrical connection between adjacent auxiliary pads 370 and prevent the electrical short problem between adjacent pads 344 due to the metal migration.

In addition, the metal migration can occur through an interface between the second layer 374 and the insulation pattern 382, but a surface length between the first and second auxiliary pads 370a and 370b is greater than the distance between the first and second auxiliary pads 370a and 370b because of the insulation pattern 382. Therefore, a path of the metal migration increases (e.g., the metal would have to flow up and around insulation pattern 382), and the possibility of the electrical connection between adjacent auxiliary pads 370 due to the metal migration decreases. Here, the surface length between the first and second auxiliary pads 370a and 370b includes a length along an exposed upper surface of the insulation pattern 382 and lengths along exposed side surfaces of the insulation pattern 382.

A light-emitting layer 392 is formed on the first electrode 360. The light-emitting layer 392 insulation pattern 382 include an organic luminous material such as, a phosphorescent compound or a fluorescent compound, or an inorganic luminous material such as a quantum dot.

A second electrode 394 is formed on the light-emitting layer 392 in the display area DA. The second electrode 394 is disposed substantially all over the display area DA and is formed of a conductive material having relatively low work function to be able to act as a cathode.

The first electrode 360, the second electrode 394 facing the first electrode 360, and the light-emitting layer 392 interposed between the first and second electrodes 360 and 394 constitute the light-emitting diode D.

As stated above, in the electroluminescent display device 300 according to the third embodiment of the present disclosure, since the insulation pattern 382 is disposed between the first and second auxiliary pads 370a and 370b while also covering the side surfaces of the first and second auxiliary pads 370a and 370b, the metal migration from the second layer 374 is blocked (e.g., insulation pattern 382 acts like a dam holding back any potential metal migration), and it is possible to prevent the electrical connection between adjacent auxiliary pads 370 and prevent the electrical short between adjacent pads 344 due to any metal migration.

In addition, since the insulation pattern 382 does not overlap ends of the first and second auxiliary pads 370a and 370b, the contact area between the first and second auxiliary pads 370a and 370b and the circuit board is prevented from being decreased (e.g., more space is allowed for easier connection between the circuit board and the auxiliary pads).

Figure 7:
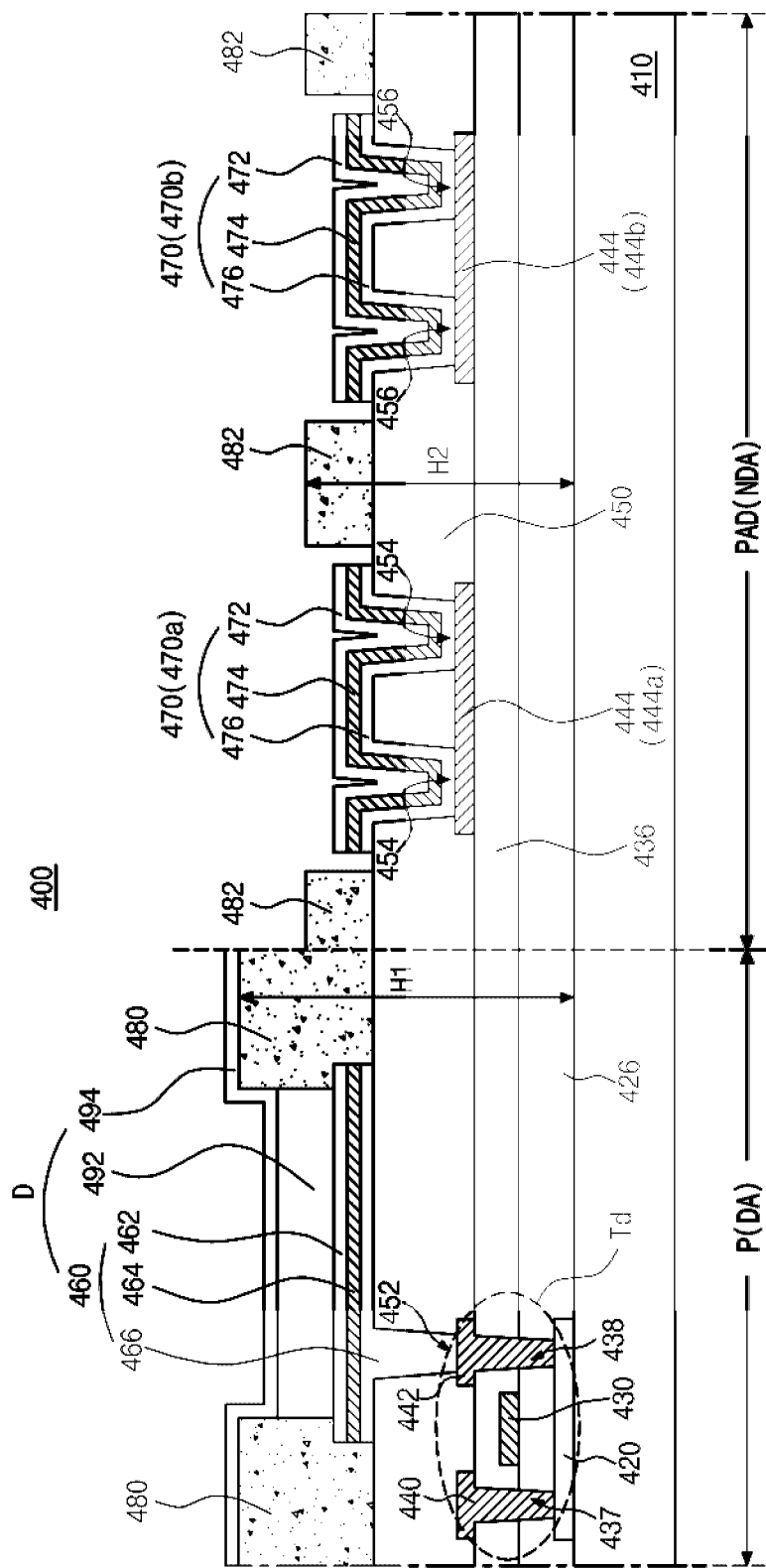
FIG. 7 is a schematic cross-sectional view of an electroluminescent display device according to another embodiment of the present disclosure.

FIG. 7 is a schematic cross-sectional view of an electroluminescent display device according to a fourth embodiment of the present disclosure. The electroluminescent display device of the fourth embodiment has similar or same parts as that of the first embodiment, and descriptions of the similar or same parts will be omitted or shortened.

In FIG. 7, the electroluminescent display device 400 according to the fourth embodiment of the present disclosure includes a substrate 410, a light-emitting diode D, a pad 444, an auxiliary pad 470 connected to the pad 444, and an insulation pattern 482 disposed between adjacent auxiliary pads 470 and spaced apart from the auxiliary pads 470.

The pad 444 can be a data pad connected to a data line DL of FIG. 3. Alternatively, the pad 444 may be a gate pad, and in this instance, the gate pad can be formed of the same material and on the same layer as a gate line GL of FIG. 3.

A display area DA including a plurality of pixel regions P and a non-display area NDA disposed outside the display area DA and including a pad region PAD are defined on the substrate 410.

A driving thin film transistor Td is formed in the pixel region P of the display area DA on the substrate 410, and the pad 444 is formed in the pad region PAD of the non-display area NDA on the substrate 410. The driving thin film transistor Td may include a semiconductor layer 420, a gate electrode 430, a source electrode 440 and a drain electrode 442. The pad 444 can include first and second pads 444a and 444b.

In addition, a gate insulating layer 426 and an interlayer insulating layer 436 are sequentially formed between the substrate 410 and the pad 444. The interlayer insulating layer 436 has first and second contact holes 437 and 438 exposing both side portions of the semiconductor layer 420 with the gate insulating layer 426. The source electrode 440 and the drain electrode 442 are connected to the both side portions of the semiconductor layer 420 through the first and second contact holes 437 and 438, respectively.

A passivation layer 450 is formed on the driving thin film transistor Td and the first and second pads 444a and 444b. The passivation layer 450 includes a drain contact hole 452 exposing the drain electrode 442 of the driving thin film transistor Td and first and second pad contact holes 454 and 456 exposing the first and second pads 444a and 444b, respectively.

A first electrode 460 and the auxiliary pad 470 are formed on the passivation layer 450. The first electrode 460 corresponds to each pixel region P and is connected to the drain electrode 442 of the driving thin film transistor Td through the drain contact hole 452. The auxiliary pad 470 includes first and second auxiliary pads 470a and 470b, which are connected to the first and second pads 444a and 444b through the first and second pad contact holes 454 and 456, respectively.

The first electrode 460 can be an anode. The first electrode 460 includes a first layer 462 formed of a conductive material having relatively high work function, a second layer 464 positioned under the first layer 462 and formed of a metallic material having a relatively high reflection property, and a third layer 466 positioned under the second layer 464 and formed of a conductive material having a relatively good interface property with the passivation layer 450.

For example, in the first electrode 460, the first layer 462 may be formed of a transparent conductive material such as indium tin oxide (ITO) or indium zinc oxide (IZO), the second layer 464 can be formed of a high reflective metallic material, such as silver, silver alloy, aluminum or aluminum alloy, and the third layer 466 can be formed of one of ITO, IZO and molybdenum-titanium alloy (MoTi). Here, the silver alloy or the aluminum alloy can include at least one of palladium and copper, but the present disclosure is not limited thereto.

Each of the first and second auxiliary pads 470a and 470b has the same structure as the first electrode 460. Namely, each of the first and second auxiliary pads 470a and 470b may have a structure including a first layer 472 formed of a transparent conductive material, such as ITO or IZO, a second layer 474 positioned between the first layer 472 and the passivation layer 450 and formed of silver, silver alloy, aluminum or aluminum alloy, and a third layer 476 positioned between the second layer 474 and the passivation layer 450 and formed of one of ITO, IZO and MoTi.

Also, the third layer 466 of the first electrode 460 and the third layers 476 of the first and second auxiliary pads 470a and 470b can be omitted, and the first electrode 460 and the first and second auxiliary pads 470a and 470b can have a double-layer structure including the first layers 462 and 472 formed of a transparent conductive material, such as ITO or IZO, and the second layers 464 and 474 respectively positioned between the first layers 462 and 472 and the passivation layer 450 and formed of silver, silver alloy, aluminum or aluminum alloy.

A bank 480 is formed on the passivation layer 450 and covers edges of the first electrode 460. That is, the bank 480 is disposed at a boundary of the pixel region P and has an opening corresponding to the pixel region P to thereby surround the pixel region P and expose a central portion of the first electrode 460.

In addition, the insulation pattern 482 is formed in the pad region PAD on the passivation layer 450. The insulation pattern 482 is positioned between the first and second auxiliary pads 470a and 470b and spaced apart from the first and second auxiliary pads 470a and 470b, and the insulation pattern 482 has a height (or thickness) smaller than that of the bank 480 (e.g., insulation pattern 482 is thinner than bank 480).

Also, a width of the insulation pattern 482 is smaller than a distance between the first and second auxiliary pads 470a and 470b, the bank 480 has a first height H1, and the insulation pattern 480 has a second height H2 smaller than the first height H1. The second height H2 of the insulation pattern 482 can be greater than or equal to a height of the auxiliary pad 470.

For example, in the electroluminescent display device 100 of the first embodiment, when the insulation pattern 182 has a height equal to that of the bank 180 and a step difference between the auxiliary pad 170 and the insulation pattern 182 increases, it could be difficult to connect the circuit board and the auxiliary pad 170, and design changes using anisotropic conductive particles are required.

However, in the electroluminescent display device 400 of the fourth embodiment, since the insulation pattern 482 has the second height H2 smaller than the first height H1 of the bank 480 and the step difference between the auxiliary pad 470 and the insulation pattern 482 decreases, it is easy to connect the circuit board and the auxiliary pad 470.

In FIG. 7, the bank 480 is illustrated as having a single-layer structure. Alternatively, the bank 480 can have a double-layer structure including a first bank with a hydrophilic property and a second bank of a hydrophobic property sequentially stacked. In this instance, the insulation pattern 482 can be formed of the same material as one of the first and second banks and can have a smaller height than that of the bank 480. In addition, the insulation pattern 482 can have the same thickness as one of the first and second banks.

Further, the insulation pattern 482 is illustrated as being spaced apart from the first and second auxiliary pads 470a and 470b. However, the insulation pattern 482 can have ends which are in accordance with and are in contact with and/or overlapping with ends of the first and second auxiliary pads 470a and 470b such that the insulation pattern 482 covers and contacts side surfaces of the first and second auxiliary pads 470a and 470b.

A light-emitting layer 492 is formed on the first electrode 460. The light-emitting layer 492 can include an organic luminous material, such as a phosphorescent compound or a fluorescent compound, or an inorganic luminous material such as a quantum dot.

A second electrode 494 is formed on the light-emitting layer 492 in the display area DA. The second electrode 494 is disposed substantially all over the display area DA and is formed of a conductive material having relatively low work function to be able to act as a cathode.

The first electrode 460, the second electrode 494 facing the first electrode 460, and the light-emitting layer 492 interposed between the first and second electrodes 460 and 494 constitute the light-emitting diode D.

In the electroluminescent display device 400 according to the fourth embodiment of the present disclosure, since the insulation pattern 482 has the second height H2 smaller than the first height H1 of the bank 480 and the step difference between the auxiliary pad 470 and the insulation pattern 482 decreases, it is easy to connect the circuit board and the auxiliary pad 470.

In addition, since the insulation pattern 482 is disposed between the first and second auxiliary pads 470a and 470b, a surface length (e.g., along the outermost surface perimeter) between the first and second auxiliary pads 470a and 470b is greater than a distance (e.g., "as the crow flies" through the illustrated cross section) between the first and second auxiliary pads 470a and 470b. Accordingly, a path of the metal migration increases, and it is possible to minimize the electrical connection between adjacent auxiliary pads 470 and the electrical short problem between adjacent pads 444 due to the metal migration. Here, the surface length between the first and second auxiliary pads 470a and 470b includes a length of an exposed upper surface of the insulation pattern 482, lengths of exposed side surfaces of the insulation pattern 482, a length of an upper surface of the passivation layer 450 between the first auxiliary pad 470a and the insulation pattern 482, and a length of an upper surface of the passivation layer 450 between the second auxiliary pad 470b and the insulation pattern 482.

Further, since the insulation pattern 482 is spaced apart from the first and second auxiliary pads 470a and 470b, and does not overlap and contact ends of the first and second auxiliary pads 470a and 470b, the contact area between the first and second auxiliary pads 470a and 470b and the circuit board is prevented from being decreased allowing for easier connected to the circuit board.

Figure 8:
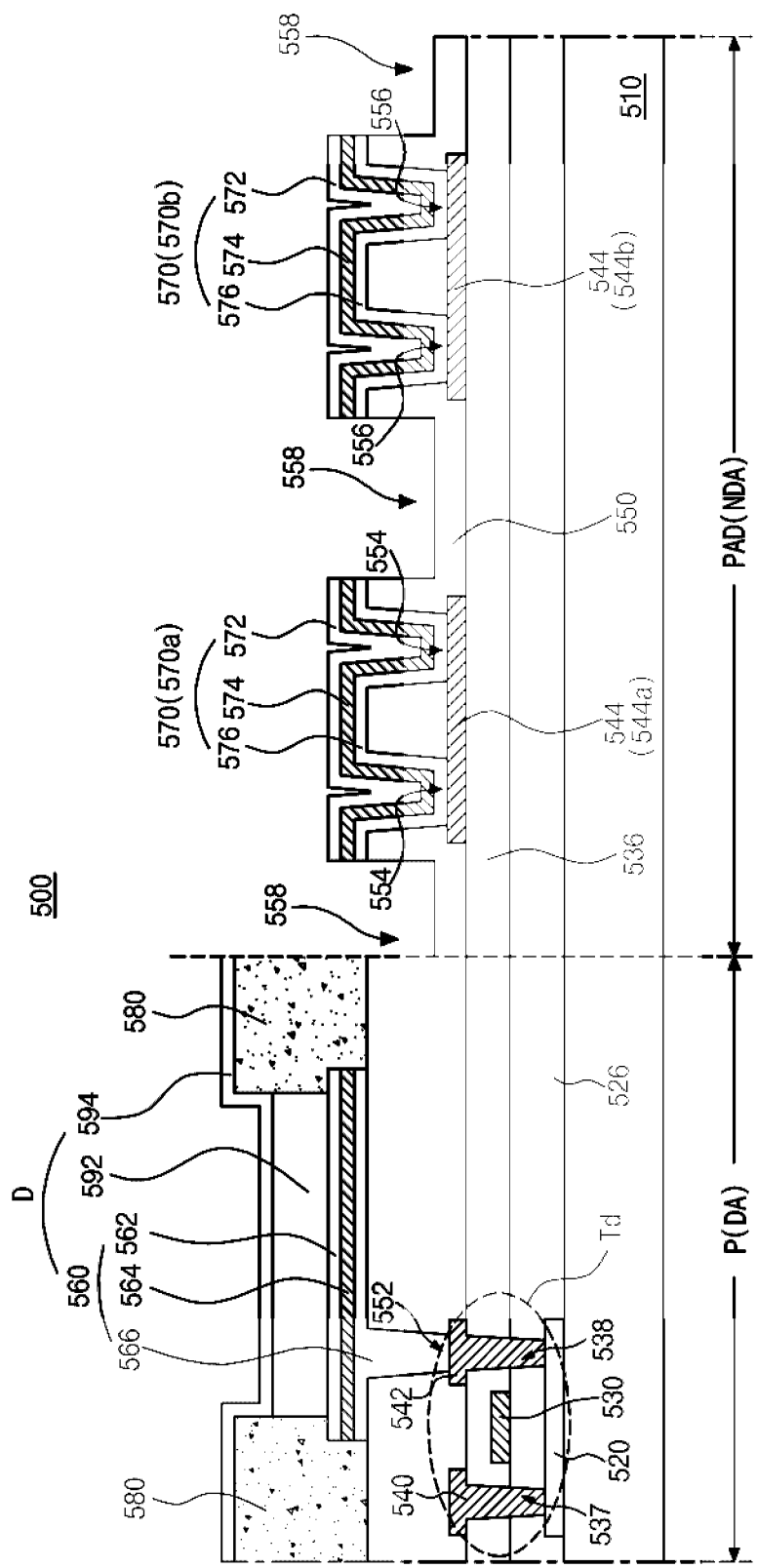
FIG. 8 is a schematic cross-sectional view of an electroluminescent display device according to an embodiment of the present disclosure.

FIG. 8 is a schematic cross-sectional view of an electroluminescent display device according to a fifth embodiment of the present disclosure. The electroluminescent display device of the fifth embodiment has similar or same parts as that of the first embodiment, and descriptions of the similar or same parts will be omitted or shortened.

In FIG. 8, the electroluminescent display device 500 according to the fifth embodiment of the present disclosure includes a substrate 510, a light-emitting diode D, a pad 544, an auxiliary pad 570 connected to the pad 544, and a dented portion 558 (e.g., a groove, ditch, or divot(s)) disposed between adjacent auxiliary pads 570. Here, the dented portion 558 can be a groove, but the present disclosure is not limited thereto.

The pad 544 can be a data pad connected to a data line DL of FIG. 3. Alternatively, the pad 544 may be a gate pad, and in this instance, the gate pad can be formed of the same material and on the same layer as a gate line GL of FIG. 3.

A display area DA including a plurality of pixel regions P and a non-display area NDA disposed outside the display area DA and including a pad region PAD are defined on the substrate 510.

A driving thin film transistor Td is formed in the pixel region P of the display area DA on the substrate 510, and the pad 544 is formed in the pad region PAD of the non-display area NDA on the substrate 510. The driving thin film transistor Td can include a semiconductor layer 520, a gate electrode 530, a source electrode 540 and a drain electrode 542. The pad 544 can include first and second pads 544a and 544b.

In addition, a gate insulating layer 526 and an interlayer insulating layer 536 are sequentially formed between the substrate 510 and the pad 544. The interlayer insulating layer 536 has first and second contact holes 537 and 538 exposing both side portions of the semiconductor layer 520 with the gate insulating layer 526. The source electrode 540 and the drain electrode 542 are connected to the both side portions of the semiconductor layer 520 through the first and second contact holes 537 and 538, respectively.

A passivation layer 550 is formed on the driving thin film transistor Td and the first and second pads 544a and 544b. The passivation layer 550 includes a drain contact hole 552 exposing the drain electrode 542 of the driving thin film transistor Td and first and second pad contact holes 554 and 556 exposing the first and second pads 544a and 544b, respectively.

In addition, the passivation layer 550 has the dented portion 558 corresponding to the pad region PAD. For example, a depth of the dented portion 558 can be smaller than a thickness of the passivation layer 550.

A first electrode 560 and the auxiliary pad 570 are formed on the passivation layer 550. The first electrode 560 corresponds to each pixel region P and is connected to the drain electrode 542 of the driving thin film transistor Td through the drain contact hole 552. The auxiliary pad 570 includes first and second auxiliary pads 570a and 570b, which are connected to the first and second pads 544a and 544b through the first and second pad contact holes 554 and 556, respectively.

The first electrode 560 can be an anode. The first electrode 560 includes a first layer 562 formed of a conductive material having relatively high work function, a second layer 564 positioned under the first layer 562 and formed of a metallic material having a relatively high reflection property, and a third layer 566 positioned under the second layer 564 and formed of a conductive material having a relatively good interface property with the passivation layer 550.

For example, in the first electrode 560, the first layer 562 can be formed of a transparent conductive material, such as indium tin oxide (ITO) or indium zinc oxide (IZO), the second layer 564 can be formed of a high reflective metallic material such as silver, silver alloy, aluminum or aluminum alloy, and the third layer 566 can be formed of one of ITO, IZO and molybdenum-titanium alloy (MoTi). Here, the silver alloy or the aluminum alloy can include at least one of palladium and copper, but the present disclosure is not limited thereto.

Each of the first and second auxiliary pads 570a and 570b has the same structure as the first electrode 560. Namely, each of the first and second auxiliary pads 570a and 570b can have a structure including a first layer 572 formed of a transparent conductive material, such as ITO or IZO, a second layer 574 positioned between the first layer 572 and the passivation layer 550 and formed of silver, silver alloy, aluminum or aluminum alloy, and a third layer 576 positioned between the second layer 574 and the passivation layer 550 and formed of one of ITO, IZO and MoTi.

In addition, the third layer 566 of the first electrode 560 and the third layers 576 of the first and second auxiliary pads 570a and 570b can be omitted, and the first electrode 560 and the first and second auxiliary pads 570a and 570b can have a double-layer structure including the first layers 562 and 572 formed of a transparent conductive material, such as ITO or IZO, and the second layers 564 and 574 respectively positioned between the first layers 562 and 572 and the passivation layer 550 and formed of silver, silver alloy, aluminum or aluminum alloy.

The first and second auxiliary pads 570a and 570b are positioned at both sides of the dented portion 558. That is, the dented portion 558 is disposed between the first and second auxiliary pads 570a and 570b. In other words, the first and second auxiliary pads 570a and 570b can positioned at opposite sides of the dented portion 558.

Also, a width of the dented portion 558 can be less than or equal to a distance between the first and second auxiliary pads 570a and 570b. Since the dented portion 558 is disposed between the first and second auxiliary pads 570a and 570b, a surface length between the first and second auxiliary pads 570a and 570b is greater than the distance between the first and second auxiliary pads 570a and 570b (e.g., the dented portion can act like a moat or a drainage ditch between adjacent auxiliary pads).

Accordingly, a path for any potential metal migration increases, and it is possible to minimize and prevent the electrical connection between adjacent auxiliary pads 570 due to the metal migration.

A bank 580 is formed on the passivation layer 550 and covers edges of the first electrode 560. That is, the bank 580 is disposed at a boundary of the pixel region P and has an opening corresponding to the pixel region P to thereby surround the pixel region P and expose a central portion of the first electrode 560.

A light-emitting layer 592 is formed on the first electrode 560. The light-emitting layer 592 can include an organic luminous material, such as a phosphorescent compound, or a fluorescent compound or an inorganic luminous material such as a quantum dot.

A second electrode 594 is formed on the light-emitting layer 592 in the display area DA. The second electrode 594 is disposed substantially all over the display area DA and is formed of a conductive material having relatively low work function to be able to act as a cathode.

The first electrode 560, the second electrode 594 facing the first electrode 560, and the light-emitting layer 592 interposed between the first and second electrodes 560 and 594 constitute the light-emitting diode D.

In the electroluminescent display device 500 according to the fifth embodiment of the present disclosure, since the dented portion 558 is formed between adjacent auxiliary pads 570, the surface length between the first and second auxiliary pads 570a and 570b is greater than the distance between the first and second auxiliary pads 570a and 570b. Accordingly, a path of the metal migration increases, and it is possible to minimize and prevent the electrical connection between adjacent auxiliary pads 570 and prevent the electrical short problem between adjacent pads 544 due to the metal migration. Here, the surface length between the first and second auxiliary pads 570a and 570b includes lengths of side surfaces and an upper surface of the passivation layer 550 corresponding to the dented portion 558.

Further, it is possible to prevent a decrease in the contact area between the auxiliary pad 570 and the circuit board due to the insulation pattern 182 of FIG. 4 and the difficulty in attaching the circuit board due to the step or stepped portions of the insulation pattern 182 of FIG. 4.

Figure 9:
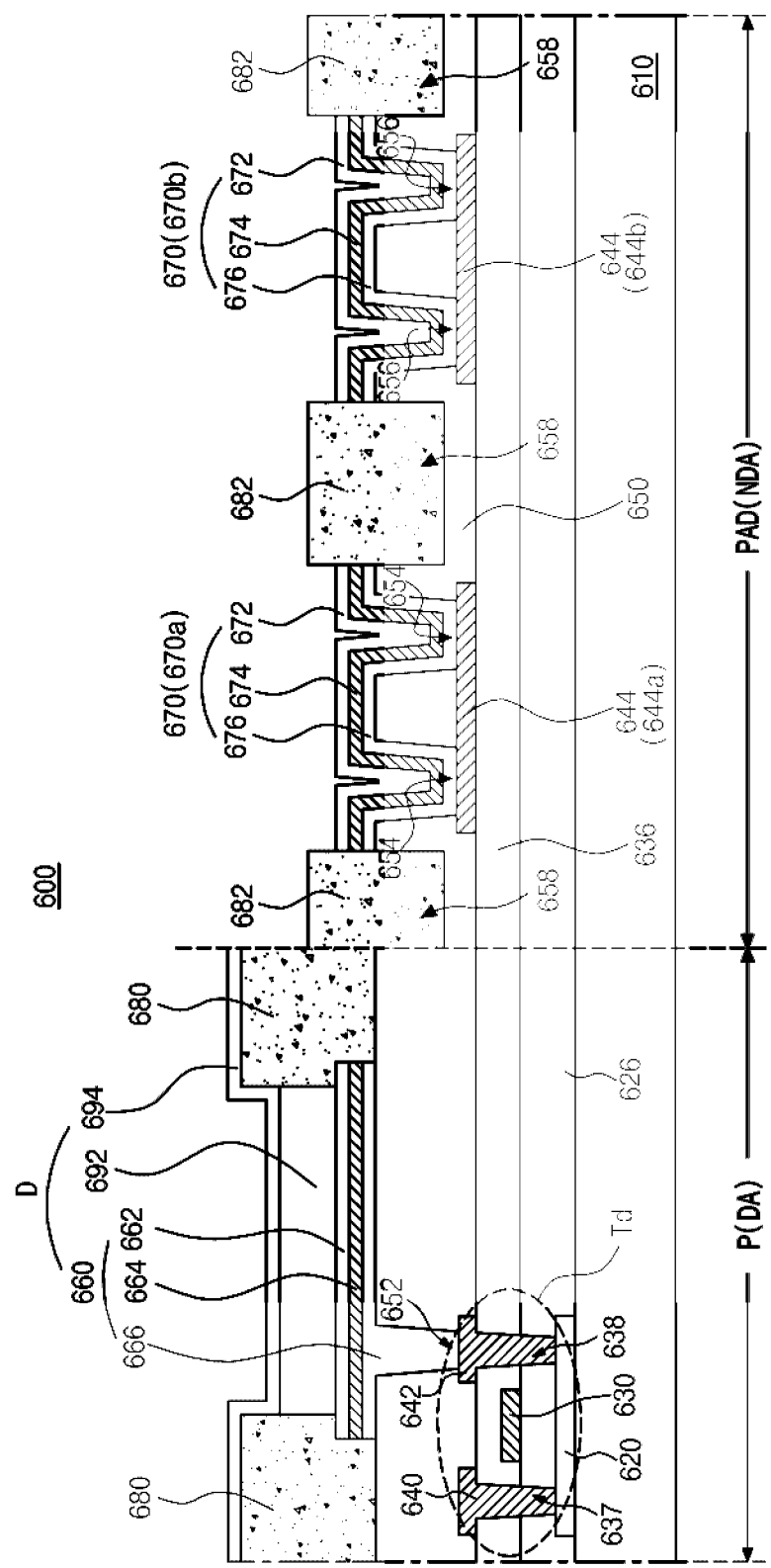
FIG. 9 is a schematic cross-sectional view of an electroluminescent display device according to another embodiment of the present disclosure.

FIG. 9 is a schematic cross-sectional view of an electroluminescent display device according to a sixth embodiment of the present disclosure. The electroluminescent display device of the sixth embodiment has similar or same parts as that of the first embodiment, and descriptions of the similar or same parts will be omitted or shortened.

In FIG. 9, the electroluminescent display device 600 according to the sixth embodiment of the present disclosure includes a substrate 610, a light-emitting diode D, a pad 644, an auxiliary pad 670 connected to the pad 644, a dented portion 658 disposed between adjacent auxiliary pads 670, and an insulation pattern 682 corresponding to the dented portion 658. Here, the dented portion 658 can be a groove, but the present disclosure is not limited thereto.

The pad 644 can be a data pad connected to a data line DL of FIG. 3. Alternatively, the pad 644 can be a gate pad, and in this instance, the gate pad can be formed of the same material and on the same layer as a gate line GL of FIG. 3.

A display area DA including a plurality of pixel regions P and a non-display area NDA disposed outside the display area DA and including a pad region PAD are defined on the substrate 610.

A driving thin film transistor Td is formed in the pixel region P of the display area DA on the substrate 610, and the pad 644 is formed in the pad region PAD of the non-display area NDA on the substrate 610. The driving thin film transistor Td can include a semiconductor layer 620, a gate electrode 630, a source electrode 640 and a drain electrode 642. The pad 644 can include first and second pads 644a and 644b.

In addition, a gate insulating layer 626 and an interlayer insulating layer 636 are sequentially formed between the substrate 610 and the pad 644. The interlayer insulating layer 636 has first and second contact holes 637 and 638 exposing both side portions of the semiconductor layer 620 with the gate insulating layer 626. The source electrode 640 and the drain electrode 642 are connected to the both side portions of the semiconductor layer 620 through the first and second contact holes 637 and 638, respectively.

A passivation layer 650 is formed on the driving thin film transistor Td and the first and second pads 644a and 644b. The passivation layer 650 includes a drain contact hole 652 exposing the drain electrode 642 of the driving thin film transistor Td and first and second pad contact holes 654 and 656 exposing the first and second pads 644a and 644b, respectively.

In addition, the passivation layer 650 has the dented portion 658 corresponding to the pad region PAD. For example, a depth of the dented portion 658 can be smaller than a thickness of the passivation layer 650 (e.g., so the passivation layer 650 can rise out of dented portion like a wall between adjacent auxiliary pads).

A first electrode 660 and the auxiliary pad 670 are formed on the passivation layer 650. The first electrode 660 corresponds to each pixel region P and is connected to the drain electrode 642 of the driving thin film transistor Td through the drain contact hole 652. The auxiliary pad 670 includes first and second auxiliary pads 670a and 670b, which are connected to the first and second pads 644a and 644b through the first and second pad contact holes 654 and 656, respectively.

The first electrode 660 can be an anode. The first electrode 660 includes a first layer 662 formed of a conductive material having relatively high work function, a second layer 664 positioned under the first layer 662 and formed of a metallic material having a relatively high reflection property, and a third layer 666 positioned under the second layer 664 and formed of a conductive material having a relatively good interface property with the passivation layer 650.

For example, in the first electrode 660, the first layer 662 can be formed of a transparent conductive material, such as indium tin oxide (ITO) or indium zinc oxide (IZO), the second layer 664 can be formed of a high reflective metallic material such as, silver, silver alloy, aluminum or aluminum alloy, and the third layer 666 can be formed of one of ITO, IZO and molybdenum-titanium alloy (MoTi). Here, the silver alloy or the aluminum alloy can include at least one of palladium and copper, but the present disclosure is not limited thereto.

Each of the first and second auxiliary pads 670a and 670b has the same structure as the first electrode 660. Namely, each of the first and second auxiliary pads 670a and 670b can have a structure including a first layer 672 formed of a transparent conductive material such as ITO or IZO, a second layer 674 positioned between the first layer 672 and the passivation layer 650 and formed of silver, silver alloy, aluminum or aluminum alloy, and a third layer 676 positioned between the second layer 674 and the passivation layer 650 and formed of one of ITO, IZO and MoTi.

In addition, the third layer 666 of the first electrode 660 and the third layers 676 of the first and second auxiliary pads 670a and 670b can be omitted, and the first electrode 660 and the first and second auxiliary pads 670a and 670b can have a double-layer structure including the first layers 662 and 672 formed of a transparent conductive material, such as ITO or IZO, and the second layers 664 and 674 respectively positioned between the first layers 662 and 672 and the passivation layer 650 and formed of silver, silver alloy, aluminum or aluminum alloy.

The first and second auxiliary pads 670a and 670b are positioned at both sides of the dented portion 658. That is, the dented portion 658 is disposed between the first and second auxiliary pads 670a and 670b, and a width of the dented portion 658 is less than or equal to a distance between the first and second auxiliary pads 670a and 670b.

A bank 680 is formed on the passivation layer 650 and covers edges of the first electrode 660. That is, the bank 680 is disposed at a boundary of the pixel region P and has an opening corresponding to the pixel region P to thereby surround the pixel region P and expose a central portion of the first electrode 660.

In addition, the insulation pattern 682 is formed in the pad region PAD on the passivation layer 650. The insulation pattern 682 is positioned between the first and second auxiliary pads 670a and 670b and corresponds to the dented portion 658. The insulation pattern 682 can be disposed in the dented portion 658 (e.g., like a wall inside a moat or ditch). The insulation pattern 682 is in contact with the first and second auxiliary pads 670a and 670b. Here, ends of the insulation pattern 682 are in accordance with and are in contact with ends of the first and second auxiliary pads 670a and 670b, and thus side surfaces of the insulation pattern 682 contact and cover side surfaces of the first and second auxiliary pads 670a and 670b. That is, a width of the insulation pattern 682 is equal to the distance between the first and second auxiliary pads 670a and 670b. Since the insulation pattern 682 is disposed between the first and second auxiliary pads 670a and 670b while covering the side surfaces of the first and second auxiliary pads 670a and 670b, the metal migration from the second layer 674 is blocked, and it is possible to prevent the electrical connection between adjacent auxiliary pads 670 and prevent the electrical short between adjacent pads 644 due to any metal migration.

Further, although the insulation pattern 682 has the same thickness as the bank 680, a height of the insulation pattern 682 decreases due to the indented portion 658 as compared with a height of the bank 680. Therefore, since a step difference between the auxiliary pad 670 and the insulation pattern 682 decreases, it is easy to connect the circuit board and the auxiliary pad 670.

Also, the insulation pattern 682 can be formed to be spaced apart from the first and second auxiliary pads 670a and 670b. In this instance, a surface length between the first and second auxiliary pads 670a and 670b can be greater than the distance between the first and second auxiliary pads 670a and 670b, and a path for any metal migration can be further increased. Here, the surface length between the first and second auxiliary pads 670a and 670b includes a length of an exposed upper surface of the insulation pattern 682, lengths of exposed side surfaces of the insulation pattern 682, and lengths of side surfaces and an upper surface of the passivation layer 650 corresponding to the dented portion 658.

A light-emitting layer 692 is formed on the first electrode 660. The light-emitting layer 692 can include an organic luminous material such as a phosphorescent compound or a fluorescent compound or an inorganic luminous material such as a quantum dot.

A second electrode 694 is formed on the light-emitting layer 692 in the display area DA. The second electrode 694 is disposed substantially all over the display area DA and is formed of a conductive material having relatively low work function to be able to act as a cathode.

The first electrode 660, the second electrode 694 facing the first electrode 660, and the light-emitting layer 692 interposed between the first and second electrodes 660 and 694 constitute the light-emitting diode D.

In the electroluminescent display device 600 according to the sixth embodiment of the present disclosure, since the dented portion 658 is formed to correspond to the dented portion 658, the metal migration can be blocked, and/or the step difference due to the insulation pattern 682 can be decreased while still increasing the path of the metal migration.

Accordingly, it is possible to prevent a decrease in the contact area between the auxiliary pad 670 and the circuit board and the electrical short between adjacent pads 644 without the difficulty in attaching the circuit board.

As described above, in the electroluminescent display device according to the embodiments of the present disclosure, the insulation pattern and/or the dented portion are formed between adjacent auxiliary pads, and thus it is possible to minimize or prevent the metal migration problem from the layer formed of silver, silver alloy, aluminum or aluminum alloy in the auxiliary pads having a stack structure.

Therefore, the electrical connection between adjacent auxiliary pads and the electrical short between adjacent pads due to the metal migration can be prevented.

It will be apparent to those skilled in the art that various modifications and variations can be made in a display device of the present disclosure without departing from the sprit or scope of the embodiments. Thus, it is intended that the present disclosure covers the modifications and variations of this invention provided they come within the scope of the appended claims and their equivalents.

What is claimed is:

1. An electroluminescent display device, comprising:
   a substrate on which a display area and a pad region are defined;
   a thin film transistor in the display area on the substrate;
   first and second pads in the pad region on the substrate;
   an insulating layer covering the thin film transistor and the first and second pads;
   first and second pad contact holes disposed in the insulating layer and exposing the first and second pads, respectively;
   a light-emitting diode on the insulating layer in the display area, the light-emitting diode being electrically connected to the thin film transistor and including first and second electrodes and a light-emitting layer interposed therebetween; and
   first and second auxiliary pads on the insulating layer in the pad region, the first and second auxiliary pads being electrically connected to the first and second pads through the first and second pad contact holes, respectively,
   wherein each of the first electrode and the first and second auxiliary pads includes a first layer formed of a transparent conductive material and a second layer formed of a metallic material,
   wherein an insulation pattern or a dented portion is disposed between the first and second auxiliary pads so that a surface length between the first and second auxiliary pads is greater than a distance between the first and second auxiliary pads, and
   wherein the first auxiliary pad is electrically isolated from the second auxiliary pad.

2. The electroluminescent display device of claim 1, wherein the surface length is a distance along outermost exposed surfaces between the first auxiliary pad and the second auxiliary pad.

3. The electroluminescent display device of claim 1, wherein the insulation pattern is disposed between the first and second auxiliary pads, and
   wherein the insulation pattern is spaced apart from each of the first and second auxiliary pads.

4. The electroluminescent display device of claim 1, wherein the insulation pattern is disposed between the first and second auxiliary pads, and
   wherein side surfaces of the insulation pattern contact corresponding side surfaces of the first and second auxiliary pads, respectively.

5. The electroluminescent display device of claim 1, wherein the insulation pattern is disposed between the first and second auxiliary pads, and
   wherein the insulation pattern overlaps edges of the first and second auxiliary pads.

6. The electroluminescent display device of claim 5, wherein the insulation pattern has a reverse tapered shaped relative to the substrate.

7. The electroluminescent display device of claim 1, further comprising:
   a bank covering edges of the first electrode,
   wherein the insulation pattern is disposed between the first and second auxiliary pads.

8. The electroluminescent display device of claim 7, wherein the bank has a first height from the substrate, and the insulation pattern has a second height from the substrate, and
   wherein the second height is smaller than the first height.

9. The electroluminescent display device of claim 7, wherein the bank includes a first bank and a second bank, and the insulation pattern has a same thickness as one of the first and second banks.

10. The electroluminescent display device of claim 1, wherein the insulating layer includes the dented portion disposed between the first and second auxiliary pads.

11. The electroluminescent display device of claim 10, further comprising:
a bank covering edges of the first electrode,
wherein the insulation pattern is disposed in the dented portion between the first and second auxiliary pads.

12. The electroluminescent display device of claim 1, wherein each one of the first electrode and the first and second auxiliary pads further includes:
a third layer formed of a conductive material different from the second layer, and the second layer being disposed between the first layer and the third layer.

13. The electroluminescent display device of claim 1, wherein the metallic material includes silver or aluminum.

14. The electroluminescent display device of claim 1, wherein the insulation pattern is disposed between the first and second auxiliary pads,
wherein the first auxiliary pad is adjacent to the second auxiliary pad, and
wherein the first and second auxiliary pads are disposed on opposite sides of the insulation pattern.

15. A display device, comprising:
a substrate having a display area and a pad region;
a thin film transistor disposed on the substrate;
a first pad and a second pad disposed in the pad region;
a light-emitting diode disposed in the display area and including a first electrode, a light-emitting layer and a second electrode, the light-emitting diode being electrically connected with the thin film transistor; and
a first auxiliary pad and a second auxiliary pad disposed in the pad region and electrically connected to the first and second pads, respectively,
wherein the first auxiliary pad includes:
a first transparent conductive layer, and
a second metallic layer,
wherein the second auxiliary pad includes:
a first transparent conductive layer, and
a second metallic layer, and
wherein an insulation pattern or a dented portion is disposed between the first and second auxiliary pads so that a surface length between the first auxiliary pad and the second auxiliary pad is greater than a distance between the first auxiliary pad and the second auxiliary pad, and
wherein the first auxiliary pad is electrically isolated from the second auxiliary pad.

16. The display device of claim 15, wherein the insulation pattern is disposed between the first auxiliary pad and the second auxiliary pad.

17. The display device of claim 15, wherein the dented portion is disposed between the first auxiliary pad and the second auxiliary pad.

18. The display device of claim 15, wherein the first auxiliary pad further includes a third transparent conductive layer,
wherein the second auxiliary pad further includes a third transparent conductive layer.

19. The display device of claim 16, where the first electrode of the light-emitting diode includes:
a first transparent conductive layer,
a second metallic layer, and
a third transparent conductive layer,
wherein each one of the first transparent conductive layers in the first electrode, the first auxiliary pad and the second auxiliary pad includes a same material,
wherein each one of the second metallic layers in the first electrode, the first auxiliary pad and the second auxiliary pad includes a same material, and
wherein each one of the third transparent conductive layers in the first electrode, the first auxiliary pad and the second auxiliary pad includes a same material.

20. A display device, comprising:
a substrate having a display area and a pad region;
a first pad and a second pad disposed in the pad region;
a light-emitting diode disposed in the display area and including a first electrode, a light-emitting layer and a second electrode, the first electrode including:
a first transparent conductive layer,
a second metallic layer, and
a third transparent conductive layer;
a first auxiliary pad electrically connected to the first pad, the first auxiliary pad including:
a first transparent conductive layer,
a second metallic layer, and
a third transparent conductive layer; and
a second auxiliary pad electrically connected to the second pad, the second auxiliary pad including:
a first transparent conductive layer,
a second metallic layer, and
a third transparent conductive layer,
wherein an insulation pattern or a dented portion is disposed between the first and second auxiliary pads so that a surface length between the first auxiliary pad and the second auxiliary pad is greater than a distance between the first auxiliary pad and the second auxiliary pad, and
wherein the first auxiliary pad is electrically isolated from the second auxiliary pad.

* * * * *